(12) United States Patent
Mattmann et al.

(10) Patent No.: US 11,276,623 B2
(45) Date of Patent: Mar. 15, 2022

(54) POWER ELECTRONICS ASSEMBLY INCLUDING A CIRCUIT CARRIER

(71) Applicant: CONTINENTAL AUTOMOTIVE GMBH, Hannover (DE)

(72) Inventors: Erich Mattmann, Heidesheim (DE); Sabine Bergmann, Hattersheim am Main (DE); Roland Brey, Eschlkam (DE); Soeren Rittstieg, Neutraubling (DE)

(73) Assignee: VITESCO TECHNOLOGIES GMBH, Hannover (DE)

( * ) Notice: Subject to any disclaimer, the term of this patent is extended or adjusted under 35 U.S.C. 154(b) by 0 days.

(21) Appl. No.: 15/898,596

(22) Filed: Feb. 18, 2018

(65) Prior Publication Data

US 2018/0174947 A1  Jun. 21, 2018

Related U.S. Application Data

(63) Continuation of application No. PCT/EP2016/068859, filed on Aug. 8, 2016.

(30) Foreign Application Priority Data

Aug. 21, 2015 (DE) .................. 10 2015 216 047.5

(51) Int. Cl.
*H01L 23/373* (2006.01)
*H01L 23/492* (2006.01)
(Continued)

(52) U.S. Cl.
CPC .......... *H01L 23/3735* (2013.01); *C23C 24/04* (2013.01); *C23C 28/321* (2013.01);
(Continued)

(58) Field of Classification Search
CPC .............. H01L 23/3735; H01L 23/492; H01L 23/49568; C23C 28/321; C23C 24/04
See application file for complete search history.

(56) References Cited

U.S. PATENT DOCUMENTS

| 2012/0001349 A1 | 1/2012 | Harada et al. |
| 2013/0069213 A1* | 3/2013 | Sohn .................. H01L 23/3107 257/668 |

(Continued)

FOREIGN PATENT DOCUMENTS

| CN | 103703560 A | 4/2014 |
| DE | 112008001037 T5 | 4/2010 |

(Continued)

OTHER PUBLICATIONS

JP202222327 (Nov. 12, 2012) (Year: 2012).*

(Continued)

*Primary Examiner* — Ahmed N Sefer

(57) ABSTRACT

A circuit carrier for holding at least one electrical power component is disclosed. The circuit carrier including a heat sink for holding and for cooling the power component. The heat sink having a surface. The circuit carrier includes a copper layer for mechanically connecting the heat sink to at least one copper plate, where the copper layer includes copper or a copper alloy and is cold-gas-sprayed or sintered on the surface of the heat sink. The circuit carrier also includes at least one copper plate for mechanically and electrically connecting the power component to the copper layer. The copper plate includes copper or a copper alloy and is arranged directly on a surface of the copper layer facing away from the heat sink and is areally, mechanically and electrically conductively connected to the copper layer.

12 Claims, 1 Drawing Sheet

(51) Int. Cl.
  *C23C 24/04* (2006.01)
  *C23C 28/00* (2006.01)
  *H01L 23/495* (2006.01)

(52) U.S. Cl.
  CPC ...... *H01L 23/492* (2013.01); *H01L 23/49568* (2013.01); H01L 2224/32225 (2013.01); H01L 2224/48091 (2013.01); H01L 2224/48227 (2013.01); H01L 2224/48472 (2013.01); H01L 2224/73265 (2013.01); H01L 2224/83801 (2013.01)

(56) References Cited

U.S. PATENT DOCUMENTS

| | | | | |
|---|---|---|---|---|
| 2013/0105980 | A1* | 5/2013 | Yasuda | H01B 1/22 257/772 |
| 2013/0270688 | A1* | 10/2013 | Ota | H01L 23/36 257/690 |
| 2014/0044479 | A1* | 2/2014 | Ueshima | B23K 35/24 403/272 |
| 2014/0138710 | A1 | 5/2014 | Ohtsu et al. | |
| 2014/0346659 | A1* | 11/2014 | Nakamura | H02M 7/003 257/704 |
| 2015/0091151 | A1* | 4/2015 | Kulas | H01L 21/4882 257/690 |
| 2015/0223317 | A1* | 8/2015 | Oi | H05K 1/181 361/709 |
| 2016/0219689 | A1* | 7/2016 | Nakamura | H01L 25/162 |
| 2016/0365333 | A1* | 12/2016 | Hohlfeld | H01L 23/3672 |
| 2017/0064808 | A1* | 3/2017 | Rizza | H01L 25/50 |

FOREIGN PATENT DOCUMENTS

| | | |
|---|---|---|
| DE | 102011076774 A1 | 12/2012 |
| JP | H06283639 A | 10/1994 |
| JP | 2009038162 A | 2/2009 |
| JP | 2012222327 A | 11/2012 |
| WO | 2016016140 A1 | 2/2016 |

OTHER PUBLICATIONS

International Search Report and Written Opinion dated Oct. 21, 2016 from corresponding International Patent Application No. PCT/EP2016/068859.

German Office Action dated Jun. 24, 2016 for corresponding German Patent Application No. 10 2015 216 047.5.

* cited by examiner

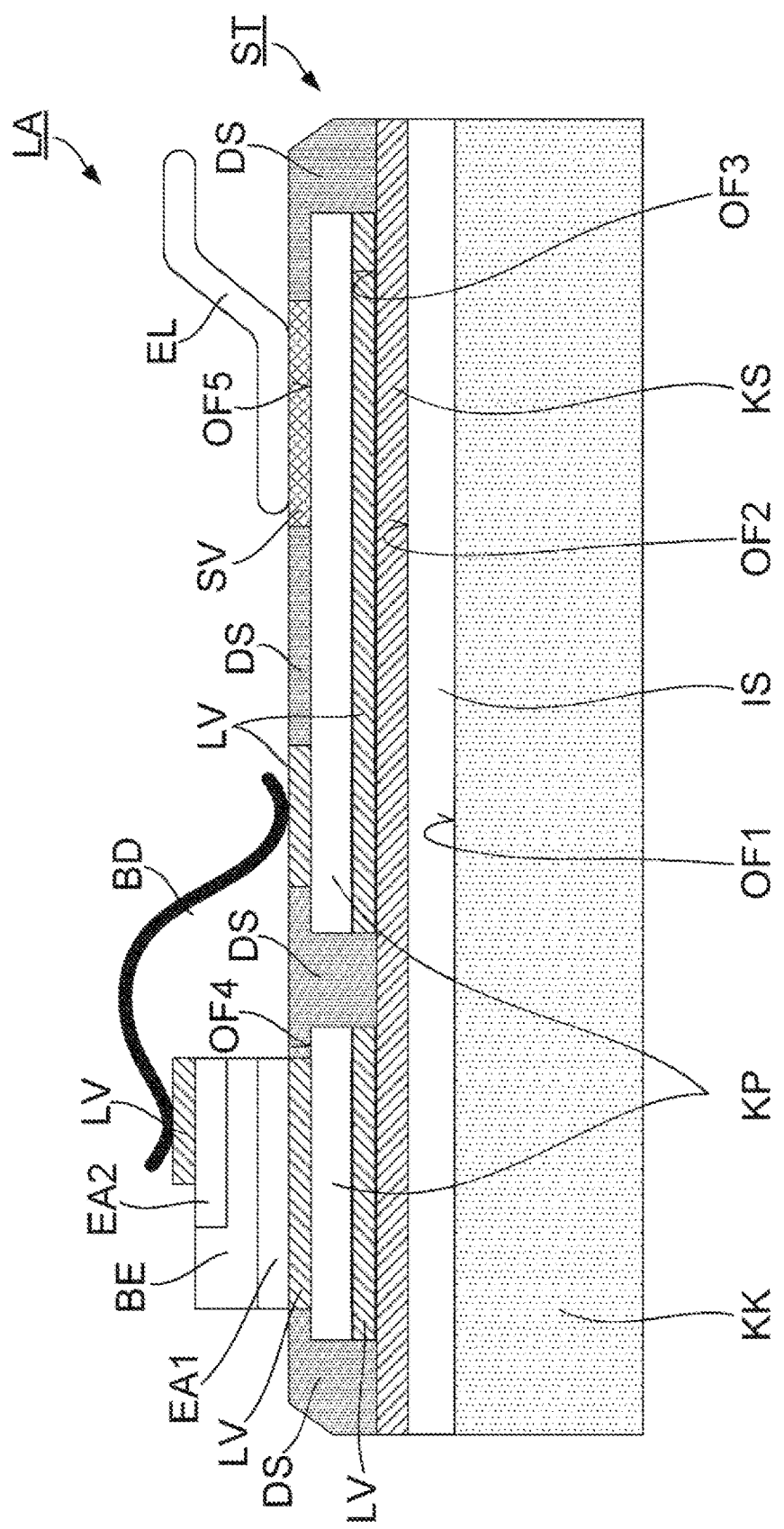

POWER ELECTRONICS ASSEMBLY INCLUDING A CIRCUIT CARRIER

CROSS-REFERENCE TO RELATED APPLICATIONS

This application claims the benefit of PCT Application PCT/EP2016/068859, filed Aug. 8, 2016, which claims priority to German Application DE 10 2015 216 047.5, filed Aug. 21, 2015. The disclosures of the above applications are incorporated herein by reference.

TECHNICAL FIELD

The disclosure relates to a circuit carrier for holding at least one electrical power component and to a power electronics arrangement that include the circuit carrier.

BACKGROUND

Due to their high power losses and thus the associated evolution of heat, power components are generally arranged on ceramic circuit carriers (DCB) having a good thermal conductivity. Electrical conductor tracks are formed on the ceramic circuit carriers, via which conductor tracks the power components are electrically connected to one another and to external electrical components. The heat dissipation via the ceramic circuit carriers is not efficient enough, however, with the result that protection of the power components against overheating is not sufficiently ensured. The ceramic circuit carriers are expensive. Moreover, a better heat dissipation is desirable in some areas of application, such as e.g. in the automotive sector, for example, in the area of hybrid electric/electric vehicles.

SUMMARY

The disclosure provides efficient and cost-effective heat dissipation for the power components.

One aspect of the disclosure provides a circuit carrier that includes a heat sink having a surface. The heat sink is designed to hold and to cool the power component. The circuit carrier furthermore includes a copper layer, which consists of copper or a copper alloy and is designed to mechanically connect the heat sink to at least one copper plate. In this case, the copper layer is cold-gas-sprayed or sintered on the surface of the heat sink. The circuit carrier furthermore includes at least one copper plate, which likewise consists of copper or a copper alloy and is designed to mechanically and electrically conductively connect the power component to the copper layer. In this case, the copper plate is arranged directly on a surface of the copper layer facing away from the heat sink and is areally, mechanically and electrically conductively connected to the copper layer.

Implementations of the disclosure may include one or more of the following optional features. In some implementations, a power component is a passive or an active electrical or electronic component, such as e.g., a power capacitor or a power semiconductor switch. The power component may also be an electrical conductor for transmitting currents having a current intensity of more than 100 amperes.

The heat sink serves as a cooling body and takes up the waste heat that arises at the power component during operation. Moreover, the heat sink serves as a carrier of the power component and/or of the conductor track to the power component and provides mechanical support for the power component and/or the conductor track. The heat sink thus replaces an expensive ceramic circuit carrier that would otherwise be necessary for holding the power component and the conductor track. Costs for circuit carriers are reduced as a result.

The copper layer serves as a conductor track for transmitting electric currents from/to the power component. For this purpose, the copper layer has a course structured in accordance with a predefined circuit layout of the power electronics arrangement. Moreover, the copper layer serves as an efficient heat transfer element for forwarding the waste heat from the power component to the heat sink. The copper layer is shaped in a cold gas spraying or sintering process on the surface of the heat sink.

In this application, a "layer" means a covering extended areally (in particular in a planar fashion) and composed of a corresponding material, the covering having a thickness of a maximum of 1 millimeter, for example, a maximum of 0.5 millimeter, a maximum of 0.2 millimeter, and e.g. a maximum of 0.1 millimeter. A copper layer is thus an areally extended covering composed of copper or a copper alloy having a layer thickness of less than 1 millimeter, which covering is produced by cold gas spraying or by sintering.

The copper plate is a thin plate composed of copper or a copper alloy which is stamped out or cut out in some other way e.g., from a thin metal sheet composed of copper or a copper alloy. A copper plate is, for example, not a copper layer which is produced in a cold gas spraying or sintering method or other similar coating method or is shaped on the abovementioned surface of the heat sink. The copper plate enables both a soldering connection and a welding connection. As welding partners, the copper plate can readily be welded e.g., to an electrical conductor, for example, by laser welding or welding using sonotrodes.

An "areal (mechanical and/or electrical) connection" means a (mechanical and/or electrical) connection via an extended contact area which extends substantially over the entire electrical contact area of an electrical terminal of the power component to be electrically contacted and thus offers the largest possible heat transfer area from the power component via the copper plate and the copper layer to the heat sink. The "areal connection" thus enables an efficient heat dissipation from the power component to the heat sink.

A "direct arrangement" means an arrangement of the power component on the copper plate which is formed only via a direct connection layer and without further intermediate layers or other intermediate elements which are not primarily embodied for producing a direct mechanical and physical connection of the power component to the copper plate. Therefore, the power component is areally, mechanically and electrically conductively connected directly to the copper plate only via a connection layer.

The copper layer and the copper plate composed of copper or a copper alloy have very high thermal conductivities and thus enable an efficient heat dissipation for the power component.

Furthermore, the copper layer enables a cost-effective mechanical connection of the copper plate and/or of the power component to the heat sink. Due to the fact that the copper layer is cold-gas-sprayed or sintered on the surface of the heat sink, the copper layer has a high ductility and can compensate for different thermal expansions between the heat sink and the copper plate and/or the power component. The copper layer thus ensures that the copper plate and thus also the power component remain securely adhered on the heat sink despite the mechanical stresses on account of the different thermal expansions.

An efficient and cost-effective heat dissipation for the power components is thus provided.

In some implementations, the copper layer has a thickness of at least 45 micrometers, for example, at least 50 micrometers, or at least 100 micrometers.

The copper plate may be soldered on the surface of the copper layer and serves as a connection area for connecting the copper layer to at least one power component. Since the copper layer and the copper plate include an identical or similar copper-based material, they can be soldered to one another in a simple manner. The connection area of the copper plate provides a stable electrical and mechanical connection for the high-current terminals of the power components.

In some examples, the copper plate has a material thickness of at least 0.9 millimeter, for example, at least 1 millimeter, or at least 2 millimeters.

The circuit carrier may furthermore include an insulation layer which is arranged between the surface of the heat sink and the copper layer and mechanically connects the copper layer to, and at the same time electrically insulates it from, the heat sink. In this case, the insulation layer is formed from an electrically insulating and thermally conductive material, such as, a ceramic.

In some examples, the insulation layer is cold-gas-sprayed or sintered on the surface of the heat sink.

The insulation layer may have a layer thickness which is thick enough to electrically insulate the copper layer from the (possibly electrically conductive) heat sink in an effective manner, and is thin enough to be able to efficiently transfer the waste heat from the power component to the heat sink.

Another aspect of the disclosure provides a power electronics arrangement. The power electronics arrangement includes at least one power component and at least one circuit carrier described above. In this case, the power component is arranged on a surface of the copper plate of the circuit carrier facing away from the heat sink and is areally, mechanically and electrically conductively connected to the copper plate.

The details of one or more implementations of the disclosure are set forth in the accompanying drawings and the description below. Other aspects, features, and advantages will be apparent from the description and drawings, and from the claims.

DESCRIPTION OF DRAWINGS

FIG. 1 illustrates a schematic cross-sectional view of an exemplary power electronics arrangement.

Like reference symbols in the various drawings indicate like elements.

DETAILED DESCRIPTION

A power electronics arrangement LA illustrated in FIG. 1 is, for example, part of an inverter or of an output stage of the inverter for an electric drive of a hybrid electric/electric vehicle.

The power electronics arrangement LA includes a circuit carrier ST and a power semiconductor switch (power component) BE mounted onto the circuit carrier ST.

The circuit carrier ST includes a heat sink KK, which includes aluminum and is produced in a die-casting method. The heat sink KK has a planar surface OF1, on which an insulation layer IS is arranged. In this case, the insulation layer IS includes an electrically insulating, thermally conductive ceramic and is coated onto the surface OF1 of the heat sink KK in a cold gas spraying process. The insulation layer IS electrically insulates the power semiconductor switch BE from the heat sink KK and at the same time transfers waste heat from the power semiconductor switch BE to the heat sink KK.

On a surface OF2 of the insulation layer IS facing away from the heat sink KK, the circuit carrier ST has a copper layer KS, which includes a copper alloy and is coated onto the surface OF2 in a further cold gas spraying process. The copper layer KS serves for mechanically and electrically connecting copper plates KP—to be described below—to the heat sink KK.

On a surface OF3 of the copper layer KS facing away from the heat sink KK, the circuit carrier ST has two copper plates KP, which are areally, mechanically and electrically conductively soldered to the copper layer KS.

The power semiconductor switch BE is arranged on a surface OF4 of one of the two copper plates KP facing away from the heat sink KK. The power semiconductor switch BE has an areally formed electrical terminal EA1 on one surface, which is areally, mechanically and electrically conductively connected, e.g., soldered, to the copper plate KP via a soldering connection LV.

A bond wire BD is arranged on a surface OF5 of the other copper plate KP likewise facing away from the heat sink KK, the bond wire being mechanically and electrically conductively connected to the copper plate KP via a soldering connection LV. The bond wire BD is furthermore mechanically and electrically conductively soldered to a further electrical terminal EA2 of the power semiconductor switch BE.

Furthermore, an electrical conductor EL or the contact terminal thereof is arranged on the surface OF5 of the further copper plate KP and is areally, mechanically and electrically conductively connected to the copper plate KP via a welding connection SV (e.g. welded using sonotrodes).

Furthermore, a sealing layer DS is arranged on the surfaces OF3, OF4, OF5 of the copper layer KS and of the two copper plates KP, by which sealing layer exposed regions of the copper layer KS and of the two copper plates KP which are not covered by respective overlying layers or circuit components are covered in a media-tight fashion and are protected against environmental influences, such as e.g., moisture. The sealing layer DS is formed e.g., from an electrically insulating and thermally conductive mold compound that is molded onto and around the surfaces OF3, OF4, OF5.

A number of implementations have been described. Nevertheless, it will be understood that various modifications may be made without departing from the spirit and scope of the disclosure. Accordingly, other implementations are within the scope of the following claims.

What is claimed is:

1. A circuit carrier for holding at least one electrical power component, the circuit carrier comprising:
   at least one electrical power component;
   a heat sink for holding and for cooling the at least one electrical power component, the heat sink having a surface;
   a copper layer comprising copper or a copper alloy, the copper layer being cold-gas-sprayed or sintered on the surface of the heat sink; and
   a plurality of copper plates, at least one of the plurality of copper plates for mechanically and electrically connecting the at least one electrical power component to the copper layer, wherein each of the plurality of copper plates consists of copper or a copper alloy and is arranged directly on a surface of the copper layer facing away from the heat sink and is areally, mechanically and electrically conductively connected to the copper layer;

a sealing layer arranged on the surfaces of the copper layer and the surfaces of the plurality of copper plates, such that each of the plurality of copper plates extends into the sealing layer, the copper layer is disposed between the sealing layer and the heat sink, and all of the sealing layer is on one side of the copper layer, and all of the heat sink is on the opposite side of the copper layer;

wherein the copper layer mechanically connects the heat sink to the plurality of copper plates.

2. The circuit carrier of claim 1, wherein the copper layer has a thickness of at least 45 micrometers.

3. The circuit carrier of claim 1, wherein each of the plurality of copper plates are soldered on the surface of the copper layer and serves for electrically and mechanically connecting the copper layer to at least one power component.

4. The circuit carrier of claim 1, wherein at least one of the plurality of copper plates has a thickness of at least 0.9 millimeter.

5. The circuit carrier of claim 1, furthermore comprising an insulation layer which is arranged between the surface of the heat sink and the copper layer and mechanically connects the heat sink to, and electrically insulates it from, the copper layer.

6. The circuit carrier of claim 5, wherein the insulation layer is cold-gas-sprayed or sintered on the surface of the heat sink.

7. A power electronics arrangement, comprising:
at least one electrical power component; and
at least one circuit carrier for holding the at least one electrical power component, the at least one circuit carrier comprising:
a heat sink for holding and for cooling the power component, the heat sink having a surface;
a copper layer consisting of copper or a copper alloy, the copper layer being cold-gas-sprayed or sintered on the surface of the heat sink; and
a plurality of copper plates, at least one of the plurality of copper plates for mechanically and electrically connecting the electrical power component to the copper layer, wherein each of the plurality of copper plates consists of copper or a copper alloy and is arranged directly on a surface of the copper layer facing away from the heat sink and is areally, mechanically and electrically conductively connected to the copper layer;

a sealing layer arranged on the surfaces of the copper layer and the surfaces of the plurality of copper plates, such that each of the plurality of copper plates extend into the sealing layer, the copper layer is disposed between the sealing layer and the heat sink, and all of the sealing layer is on one side of the copper layer, and all of the heat sink is on the opposite side of the copper layer;

wherein the copper layer mechanically connects the heat sink to each of the plurality of copper plates; and wherein the electrical power component is arranged on a surface of one of the plurality of copper plates facing away from the heat sink and is areally mechanically and electrically conductively connected to the one of the plurality of copper plates.

8. The power electronics arrangement of claim 7, wherein the copper layer has a thickness of at least 45 micrometers.

9. The power electronics arrangement of claim 7, wherein each of the plurality of copper plates is soldered on the surface of the copper layer and serves for electrically and mechanically connecting the copper layer to at least one power component.

10. The power electronics arrangement of claim 7, wherein at least one the plurality of copper plates has a thickness of at least 0.9 millimeter.

11. The power electronics arrangement of claim 7, furthermore comprising an insulation layer which is arranged between the surface of the heat sink and the copper layer and mechanically connects the heat sink to, and electrically insulates it from, the copper layer.

12. The power electronics arrangement of claim 11, wherein the insulation layer is cold-gas-sprayed or sintered on the surface of the heat sink.

* * * * *